(12) United States Patent
Yamaoka et al.

(10) Patent No.: US 7,468,900 B2
(45) Date of Patent: Dec. 23, 2008

(54) SEMICONDUCTOR MEMORY DEVICE HAVING A BITLINE AMPLIFIED TO A POSITIVE VOLTAGE AND A NEGATIVE VOLTAGE

(75) Inventors: Kunisato Yamaoka, Osaka (JP); Hiroshige Hirano, Nara (JP); Masahiko Sakagami, Kyoto (JP)

(73) Assignee: Panasonic Corporation, Osaka (JP)

( * ) Notice: Subject to any disclaimer, the term of this patent is extended or adjusted under 35 U.S.C. 154(b) by 197 days.

(21) Appl. No.: 11/356,213

(22) Filed: Feb. 17, 2006

(65) Prior Publication Data
US 2006/0285378 A1 Dec. 21, 2006

(30) Foreign Application Priority Data
Jun. 21, 2005 (JP) .............................. 2005-180198

(51) Int. Cl.
*G11C 11/22* (2006.01)
(52) U.S. Cl. .................. 365/145; 365/208; 365/189.09; 365/203; 365/149
(58) Field of Classification Search ................ 365/145, 365/149, 203, 148, 190, 205, 208, 189.09
See application file for complete search history.

(56) References Cited

U.S. PATENT DOCUMENTS

| | | | | |
|---|---|---|---|---|
| 5,455,786 | A | 10/1995 | Takeuchi et al. | ............. 365/145 |
| 6,088,257 | A | 7/2000 | Jeon et al. | .................... 365/145 |
| 6,353,550 | B1 * | 3/2002 | Hirano | ........................ 365/145 |
| 6,809,952 | B2 * | 10/2004 | Masui | ........................ 365/145 |
| 6,956,767 | B2 * | 10/2005 | Kang | ........................ 365/175 |
| 7,139,186 | B2 * | 11/2006 | Shiraishi | ..................... 365/145 |
| 7,173,843 | B2 * | 2/2007 | Kang | ........................ 365/145 |
| 7,266,006 | B2 * | 9/2007 | Kang | ........................ 365/145 |
| 2006/0285378 | A1 * | 12/2006 | Yamaoka et al. | ............ 365/145 |

OTHER PUBLICATIONS

H. Hirano, et al., "High Density and Low Power Nonvolatile FeRAM with Non-Driven Plate and Selected Driven Bit-line Scheme", 2004 Symposium on VLSI Circuits, Digest of Technical Papers, pp. 446-447, Jun. 2004.

* cited by examiner

*Primary Examiner*—Andrew Q Tran
(74) *Attorney, Agent, or Firm*—McDermott Will & Emery LLP

(57) ABSTRACT

In order to omit a reset transistor between a storage node and a cell plate line of a memory cell, a cell plate line is fixed to a potential substantially equal to a ground potential and a bit line is driven with positive and negative voltages.

22 Claims, 9 Drawing Sheets

US 7,468,900 B2

SEMICONDUCTOR MEMORY DEVICE HAVING A BITLINE AMPLIFIED TO A POSITIVE VOLTAGE AND A NEGATIVE VOLTAGE

BACKGROUND OF THE INVENTION

1. Field of the Invention

The present invention relates to write and read operations and a memory structure of a semiconductor memory device.

2. Description of the Related Art

Recently, as small-size and high-performance electronic apparatuses having a memory function, such as a portable terminal apparatus, an IC card, and the like, have become widespread, there is an increasing demand for a low-voltage, low-power consumption, and high-speed operation semiconductor memory device suitable for these apparatuses. Particularly, there is a high demand for nonvolatile memories, such as, representatively, a flash memory. In terms of low power consumption and high speed operation, a ferroelectric memory has attracted attention. The ferroelectric memory is structured to utilize a difference between the polarization directions of a capacitor made of a ferroelectric film and thereby to store nonvolatile data. Therefore, data can be rewritten only by applying an electric field for reversing the polarization direction, whereby the ferroelectric memory is characterized by a low voltage, low power consumption, and a high speed operation.

FIG. 1 is a circuit diagram of a conventional exemplary memory cell portion, and FIG. 2 is a conventional exemplary operation timing chart. See H. Hirano, et al., "High Density and Low Power Nonvolatile FeRAM with Non-Driven Plate and Selected Driven Bit-line Scheme", 2004 Symposium on VLSI Circuits, Digest of Technical Papers, pp. 446-447, Jun. 2004.

FIG. 1 illustrates a portion of a two-transistor, two-capacitor (2T2C) memory cell array of a conventional ferroelectric memory, and peripheral circuitry thereof. BP indicates a bit line precharge signal, BP2 indicates a second bit line precharge signal, SAE indicates a sense amplifier start-up signal, WL0 to WL3 indicate first to fourth word lines, CP indicates a cell plate line, RST indicates a reset signal, BL0 and BL1 indicate first and second bit lines, 51 indicates a first memory cell transistor, 52 indicates a first ferroelectric capacitor, 53 indicates a first reset transistor, 54 indicates a second memory cell transistor, 55 indicates a second ferroelectric capacitor, and 56 indicates a second reset transistor. The second word line WL1 is connected to a gate of the first memory cell transistor 51, the first bit line BL0 is connected to a drain of the first memory cell transistor 51, and a first electrode of the first ferroelectric capacitor 52 is connected to a source (storage node) of the first memory cell transistor 51. The cell plate line CP is connected to a second electrode of the first ferroelectric capacitor 52. The reset signal RST is connected to a gate of the first reset transistor 53, the source of the first memory cell transistor 51 is connected to a drain of the first reset transistor 53, and the cell plate line CP is connected to a source of the first reset transistor 53. The second word line WL1 is connected to a gate of the second memory cell transistor 54, the second bit line BL1 is connected to a drain of the second memory cell transistor 54, and a first electrode of the second ferroelectric capacitor 55 is connected to a source (storage node) of the second memory cell transistor 54. The cell plate line CP is connected to a second electrode of the second ferroelectric capacitor 55. The reset signal RST is connected to a gate of the second reset transistor 56, the source of the second memory cell transistor 54 is connected to a drain of the second reset transistor 56, and the cell plate line CP is connected to a source of the second reset transistor 56. The first and second bit lines BL0 and BL1 are connected to the peripheral circuitry composed of a sense amplifier, a bit line precharge circuit, and the like. The cell plate line CP is fixed to 1/2VDD.

Next, a read operation and a rewrite operation when "H" data is held in the first ferroelectric capacitor 52 and "L" data is held in the second ferroelectric capacitor 55 in the above-described conventional example, will be described. Initially, it is assumed that, at time t01 of FIG. 2, BP and RST have a logic voltage "H", and BP2, WL1, and SAE have a logic voltage "L". In this case, the first and second bit lines BL0 and BL1, the cell plate line CP, and the sources of the first and second memory cell transistors 51 and 54 have a potential of 1/2VDD. Next, at time t02, when BP and RST are caused to go to the logic voltage "L", the first and second bit lines BL0 and BL1 are turned into a floating state, so that the first and second reset transistors 53 and 56 are turned OFF. At time t03, when BP2 is caused to go to the logic voltage "H", the first and second bit lines BL0 and BL1 are precharged to the logic voltage "L". When BP2 is caused to go to the logic voltage "L" at time t04, and thereafter, WL1 is caused to go to a boosted potential VPP at time t05, the "H" data is read from the first ferroelectric capacitor 52, which holds the "H" data, and a potential corresponding to the "H" data appears on the first bit line BL0, and also, the "L" data is read from the second ferroelectric capacitor 55, which holds the "L" data, and a potential corresponding to the "L" data appears on the second bit line BL1. In this situation, at time t06, when SAE is caused to go to the logic voltage "H" to start up a sense amplifier, BL0 is amplified to the logic voltage "H" and BL1 is amplified to the logic voltage "L". For time t09 to time t12, when the cell plate line CP has a potential of 1/2VDD, the logic voltage "H" is applied to the first bit line BL0, so that a potential of +1/2VDD is applied to the first ferroelectric capacitor 52, thereby the "H" data is rewritten into the first ferroelectric capacitor 52, and the logic voltage "L" is applied to the second bit line BL1, so that a potential of −1/2VDD is applied to the second ferroelectric capacitor 55, thereby the "L" data is rewritten into the second ferroelectric capacitor 55. Next, at time t12, when BP and RST are caused to go to the logic voltage "H" and SAE is caused to go to the logic voltage "L", the first and second bit lines BL0 and BL1 go to 1/2VDD. Finally, at time t13, the read and rewrite operations are ended, where WL1 has the logic voltage "L".

In the above-described conventional ferroelectric memory, when the memory is powered ON, the cell plate line CP is caused to go to 1/2VDD, and therefore, the second electrodes of the ferroelectric capacitors 52 and 55 connected to the cell plate line CP go to 1/2VDD. In this case, a potential difference occurs between the second electrodes and the floating-state first electrodes of the ferroelectric capacitors 52 and 55, so that the held data is destroyed. To prevent this, the reset transistors 53 and 56 are required as illustrated in FIG. 1, disadvantageously leading to an increase in chip size.

SUMMARY OF THE INVENTION

To solve the above-described problems, a semiconductor memory device of the present invention is characterized by driving a bit line with positive and negative voltages while fixing a cell plate line to a potential substantially equal to a ground potential.

Therefore, the semiconductor memory device of the present invention has no reset transistor between a storage node and a cell plate line of a memory cell, thereby making it possible to reduce the chip size. In addition, the present invention can provide a high-speed semiconductor memory device.

DESCRIPTION OF THE PREFERRED EMBODIMENTS

Figure 1:
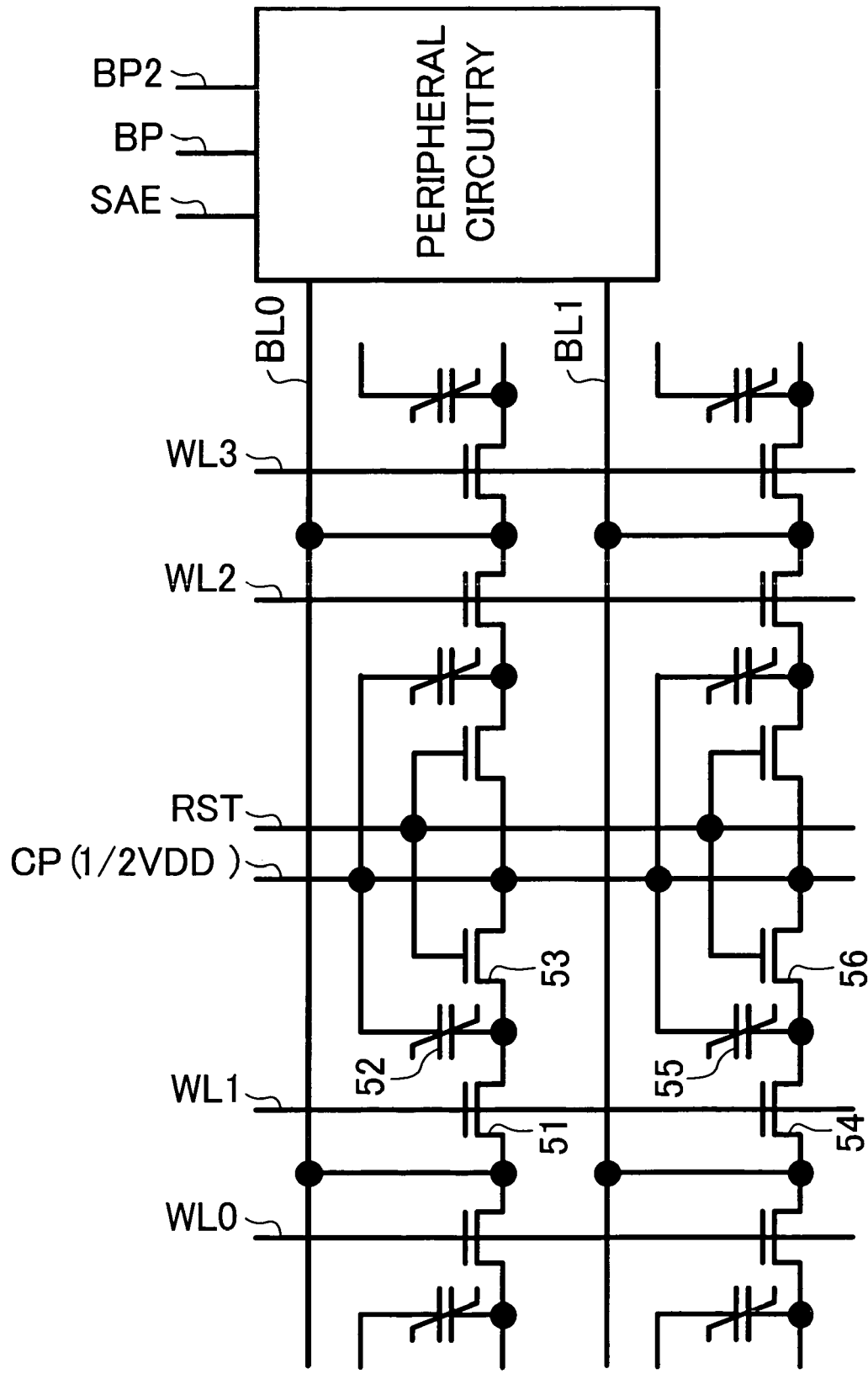
FIG. 1 is a circuit diagram of a conventional exemplary memory cell portion.
Figure 2:
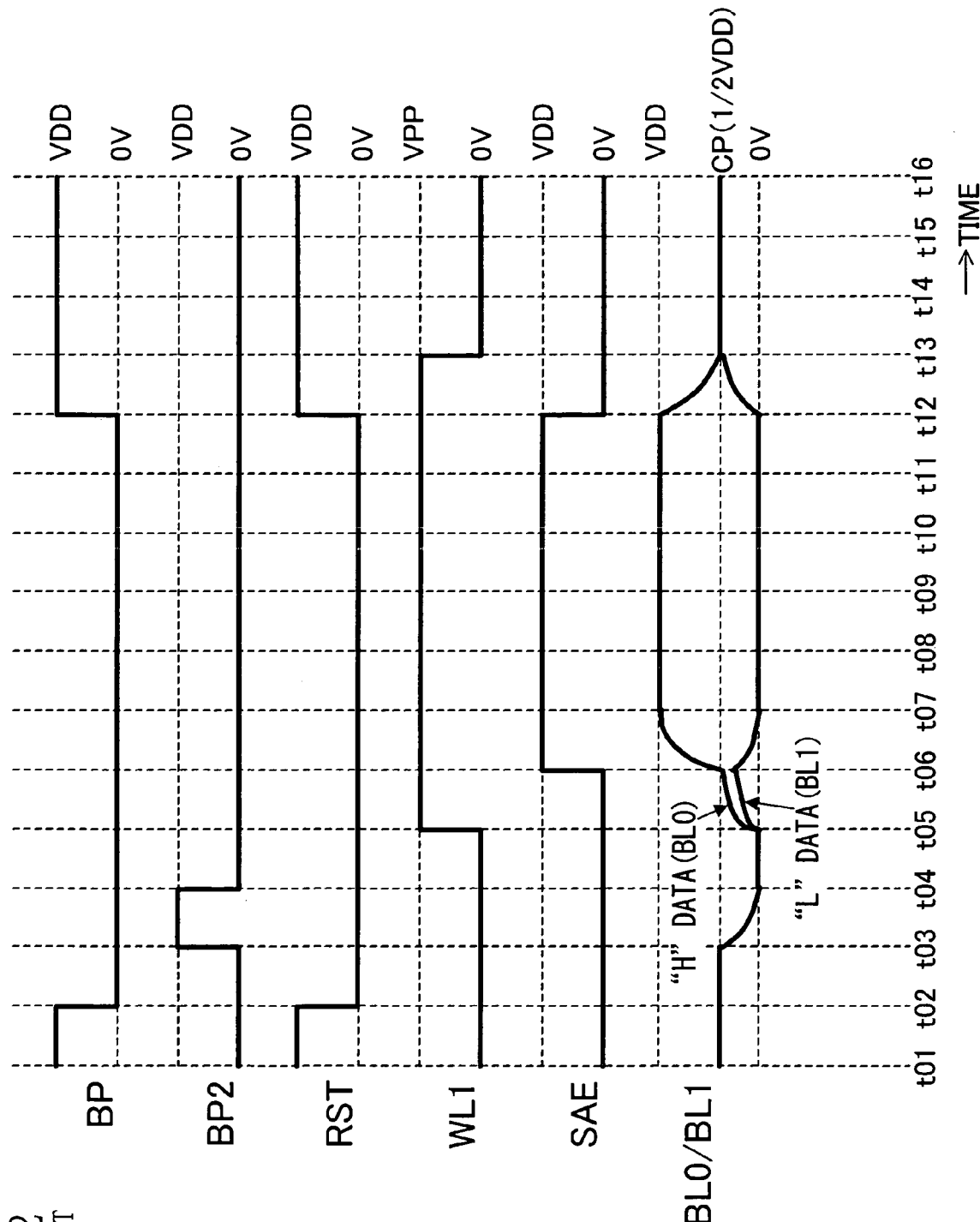
FIG. 2 is a conventional exemplary operation timing chart.
Figure 3:
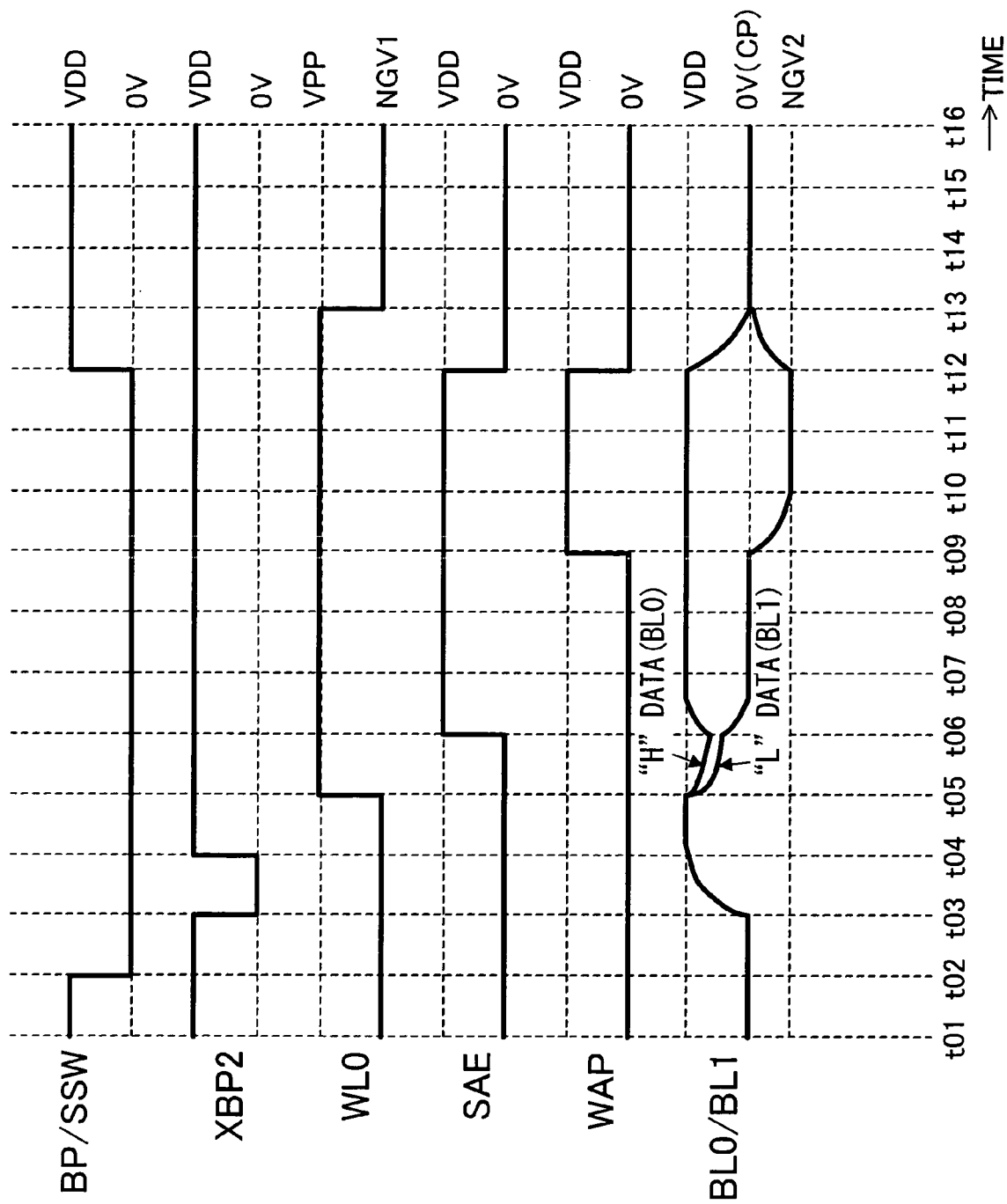
FIG. 3 is an operation timing chart of a first embodiment of the present invention.
Figure 4:
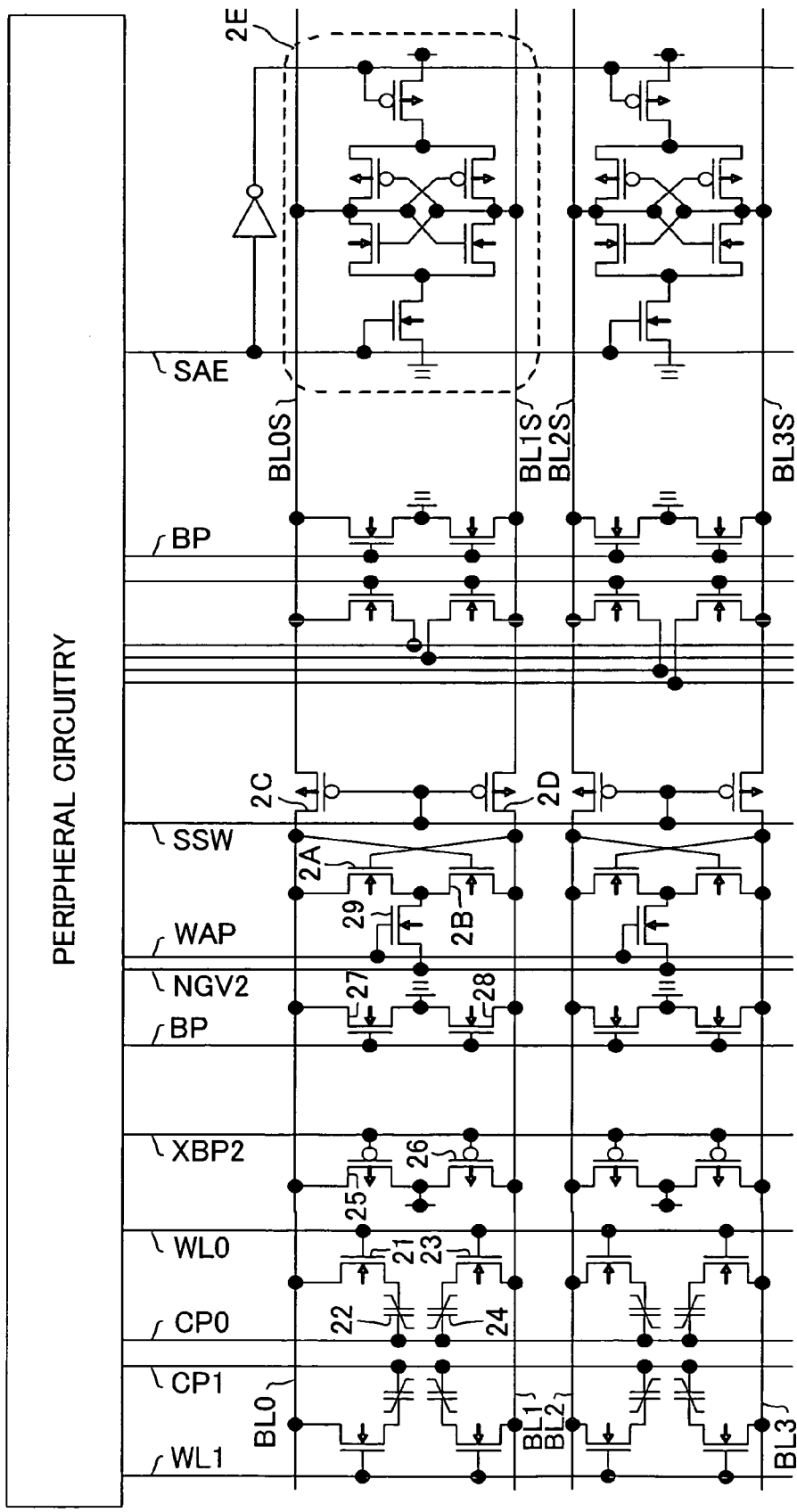
FIG. 4 is a structure diagram of the first embodiment of the present invention.

FIG. 3 is an operation timing chart of a first embodiment of the present invention. FIG. 4 is a structure diagram of the first embodiment of the present invention. A ferroelectric memory according to the first embodiment of the present invention will be described with reference to FIGS. 3 and 4.

In FIG. 3, BP indicates a first bit line precharge signal, SSW indicates a shared gate start-up signal, XBP2 indicates a second bit line precharge signal, WL0 indicates a word line, SAE indicates a sense amplifier start-up signal, WAP indicates a selected bit line amplification signal, BL0 and BL1 indicate first and second bit lines, NGV1 indicates a first negative potential, and NGV2 indicates a second negative potential.

FIG. 4 illustrates a portion of a 2T2C memory cell array of the ferroelectric memory of the first embodiment of the present invention, and peripheral circuitry thereof. BP indicates a first bit line precharge signal, SSW indicates a shared gate start-up signal, XBP2 indicates a second bit line precharge signal, SAE indicates a sense amplifier start-up signal, WAP indicates a selected bit line amplification signal, NGV2 indicates a second negative voltage, WL0 and WL1 indicate first and second word lines, CP0 and CP1 indicate first and second cell plate lines, BL0 to BL3 indicate first to fourth bit lines, BL0S to BL3S indicate first to fourth sense amplifier portion bit lines, 21 indicates a first transistor, 22 indicates a first ferroelectric capacitor, 23 indicates a second transistor, and 24 indicates a second ferroelectric capacitor. The first word line WL0 is connected to a gate of the first transistor 21, the first bit line BL0 is connected to a drain of the first transistor 21, and a first electrode of the first ferroelectric capacitor 22 is connected to a source (storage node) of the first transistor 21. The first cell plate line CP0 is connected to a second electrode of the first ferroelectric capacitor 22. The first word line WL0 is connected to a gate of the second transistor 23, the second bit line BL1 is connected to a drain of the second transistor 23, and a first electrode of the second ferroelectric capacitor 24 is connected to a source (storage node) of the second transistor 23. The first cell plate line CP0 is connected to a second electrode of the second ferroelectric capacitor 24. 25 to 2D indicate third to eleventh transistors, and 2E indicates a sense amplifier. The second bit line precharge signal XBP2 is connected to gates of the third and fourth transistors 25 and 26, VDD is connected to sources of the third and fourth transistors 25 and 26, the first bit line BL0 is connected to a drain of the third transistor 25, and the second bit line BL1 is connected to a drain of the fourth transistor 26. The first bit line precharge signal BP is connected to gates of the fifth and sixth transistors 27 and 28, a ground potential is connected to sources of the fifth and sixth transistors 27 and 28, the first bit line BL0 is connected to a drain of the fifth transistor 27, and the second bit line BL1 is connected to a drain of the sixth transistor 28. The selected bit line amplification signal WAP is connected to a gate of the seventh transistor 29, the second negative potential NGV2 is connected to a source of the seventh transistor 29, sources of the eighth and ninth transistors 2A and 2B are connected to a drain of the seventh transistor 29, the second bit line BL1 is connected to a gate of the eighth transistor 2A, a drain of the eighth transistor 2A is connected to the first bit line BL0, a gate of the ninth transistor 2B is connected to the first bit line BL0, and a drain of the ninth transistor 2B is connected to the second bit line BL1. Gates of the tenth and eleventh transistors 2C and 2D are connected to the shared gate start-up signal SSW, a drain of the tenth transistor 2C is connected to the first bit line BL0, a source of the tenth transistor 2C is connected to the first sense amplifier portion bit line BL0S, a drain of the eleventh transistor 2D is connected to the second bit line BL1, a source of the eleventh transistor 2D is connected to the second sense amplifier portion bit line BL1S. WL0 and WL1, CP0 and CP1, XBP2, BP, NGV2, WAP, SSW, and SAE are connected to the peripheral circuitry, and CP0 and CP1 are connected to the ground potential in the peripheral circuitry.

Next, in FIG. 4, a read operation and a rewrite operation when "H" data is held by the first ferroelectric capacitor 22 and "L" data is held by the second ferroelectric capacitor 24, will be described. Initially, it is assumed that, in FIG. 3, at time t01, BP, SSW, and XBP2 have a logic voltage "H", SAE and WAP have a logic voltage "L", and WL0 has NGV1. In this case, the first and second bit lines BL0 and BL1 have the logic voltage "L", since the fifth and sixth transistors 27 and 28 are ON. Next, at time t02, when BP and SSW are caused to go to the logic voltage "L", the first and second bit lines BL0 and BL1 and the first and second sense amplifier portion bit lines BL0S and BL1S go to a floating state. At time t03, when XBP2 is caused to go to the logic voltage "L", the third and fourth transistors 25 and 26 are turned ON, so that the first and second bit lines BL0 and BL1 are precharged to the logic voltage "H". When XBP2 is caused to go to the logic voltage "H", so that the third and fourth transistors 25 and 26 are turned OFF at time t04, and thereafter, the first word line WL0 is caused to go to a boosted potential VPP at time t05, the "H" data is read from the first ferroelectric capacitor 22, which holds the "H" data, and a potential corresponding to the "H" data appears on the first bit line BL0, and also, the "L" data is read from the second ferroelectric capacitor 24, which holds the "L" data, and a potential corresponding to the "L" data appears on the second bit line BL1. In this situation, at time t06, when SAE is caused to go to the logic voltage "H" to start up the sense amplifier 2E, BL0 is amplified to the logic voltage "H" and BL1 is amplified to the logic voltage "L" (ground potential). At time t09, when WAP is caused to go to the logic voltage "H", BL1 is amplified to the second negative potential NGV2. For time t09 to time t12, when the cell plate lines CP0 and CP1 have the ground potential, the logic voltage "H" is applied to the first bit line BL0, and a potential of +VDD is applied to the first ferroelectric capacitor 22, thereby the "H" data is rewritten into the first ferroelectric capacitor 22, and the second negative voltage NGV2 is applied to the second bit line BL1, and a potential of −NGV2 is applied to the second ferroelectric capacitor 24, thereby the "L" data is rewritten into the second ferroelectric capacitor 24. Next, at time t12, when BP and SSW are caused to go to the logic voltage "H" and SAE and WAP are caused to go to the logic voltage "L", the first and second bit lines BL0 and BL1 go to the logic voltage "L". Finally, at time t13, the read and rewrite operations are ended, where the first word line WL0 has the logic voltage "L".

As described above, in the ferroelectric memory of the first embodiment of the present invention, the cell plate lines CP0 and CP1 are fixed to a potential substantially equal to the ground potential, and the "H" data and the "L" data are simultaneously written, whereby a high speed operation can be achieved without an increase in chip size.

Note that if the lowest potential NGV1 of a word line amplitude is substantially equal to the lowest voltage NGV2 of a bit line amplitude, only one negative potential generating circuit is required, thereby making it possible to reduce the circuit area.

As illustrated in FIG. 4, N-channel MOS transistors may be used as the first and second transistors (memory cell transistors) 21 and 23, the lowest potential NGV1 of the word line amplitude may be larger than the lowest potential NGV2 of the bit line amplitude, and the absolute value of a difference between NGV1 and NGV2 may be smaller than thresholds of the first and second transistors 21 and 23. By causing the absolute value of NGV1 to be smaller than the absolute value of NGV2, power consumption of NGV1 can be reduced.

N-channel MOS transistors may be used as the first and second transistors 21 and 23, and the lowest potential NGV1 of the word line amplitude may be smaller than the lowest potential NGV2 of the bit line amplitude.

Also, as illustrated in FIG. 4, the first to fourth sense amplifier portion bit lines BL0S to BL3S may be separated from the first to fourth bit lines BL0 to BL3 to which memory cells are connected, via the tenth and eleventh transistors (P-channel MOS transistors) 2C and 2D. By using P-channel MOS transistors as the transistors 2C and 2D for separation, supply of a negative potential can be limited only to a memory cell portion, thereby making it possible to suppress power consumption of the negative potential generating circuit, and minimizing a scale of a negative potential control circuit, resulting in low power consumption and a small chip.

The lowest potential of the amplitude of the first to fourth sense amplifier portion bit lines BL0S to BL3S may be different from the lowest potential of the amplitude of the first to fourth bit lines BL0 to BL3 to which memory cells are connected. For example, the absolute value of the lowest potential of the amplitude of the first to fourth sense amplifier portion bit lines BL0S to BL3S is caused to be smaller than the absolute value of the lowest potential of the amplitude of the first to fourth bit lines BL0 to BL3. By reducing the amplitude of the bit lines BL0S to BL3S to which the sense amplifier 2E is connected, power consumption of the sense amplifier 2E can be reduced, resulting in low power consumption.

The difference between the potential of the cell plate lines CP0 and CP1, which is substantially equal to the ground potential, and the lowest potential NGV2 of the bit line amplitude, may be larger than or equal to a coercive voltage of the ferroelectric capacitors 22 and 24 in a memory cell. Thereby, polarization reversal can be performed by applying a voltage higher than or equal to the coercive voltage to the ferroelectric capacitors 22 and 24 in a memory cell.

As described above, in this embodiment, the first and second bit lines BL0 and BL1 are precharged to VDD. In addition, by causing the word line WL0 to be the boosted potential VPP at time t05 of FIG. 3, and thereafter, starting up the sense amplifier 2E at time t06, it is possible to reduce a time required to amplify the potentials of the first and second bit lines BL0 and BL1 to VDD and 0 V, respectively.

As illustrated in FIG. 3, the potential amplitude of the first and second bit lines BL0 and BL1 amplified after starting up the selected bit line amplification signal WAP at time t09 is larger than that amplified after starting up the sense amplifier 2E at time t06. Thus, by causing the bit line amplitude amplified by the sense amplifier 2E to be smaller than the bit line amplitude when a memory cell is written, power consumption can be reduced.

Figure 5:
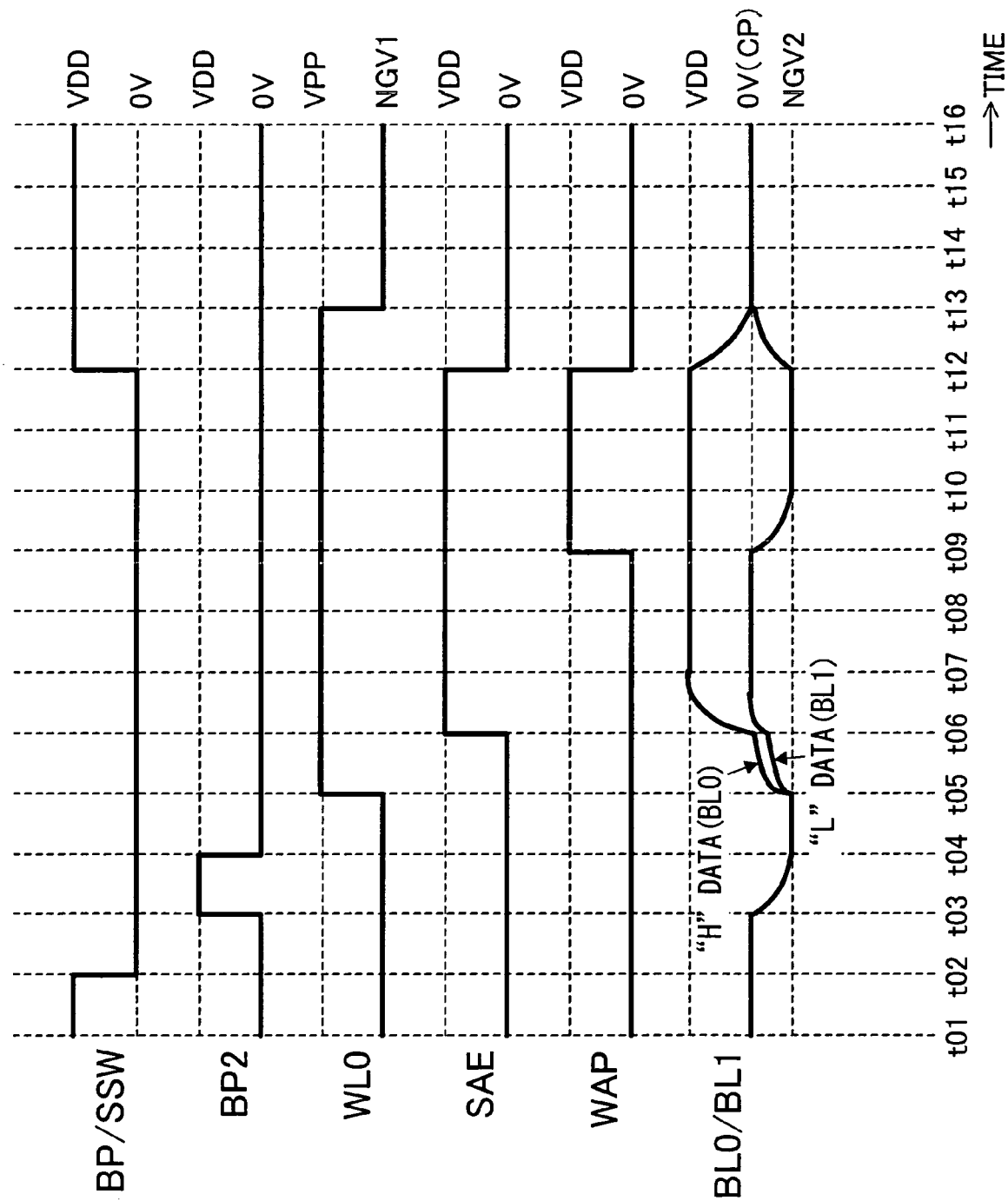
FIG. 5 is an operation timing chart of a second embodiment of the present invention.

Next, a ferroelectric memory according to a second embodiment of the present invention will be described with reference to the drawings. FIG. 5 is an operation timing chart of the second embodiment of the present invention, and FIG. 6 is a structure diagram of the second embodiment of the present invention.

In FIG. 5, BP indicates a first bit line precharge signal, SSW indicates a shared gate start-up signal, BP2 indicates a second bit line precharge signal, WL0 indicates a word line, SAE indicates a sense amplifier start-up signal, WAP indicates a selected bit line amplification signal, BL0 and BL1 indicate first and second bit lines, NGV1 indicates a first negative potential, and NGV2 indicates a second negative potential.

Figure 6:
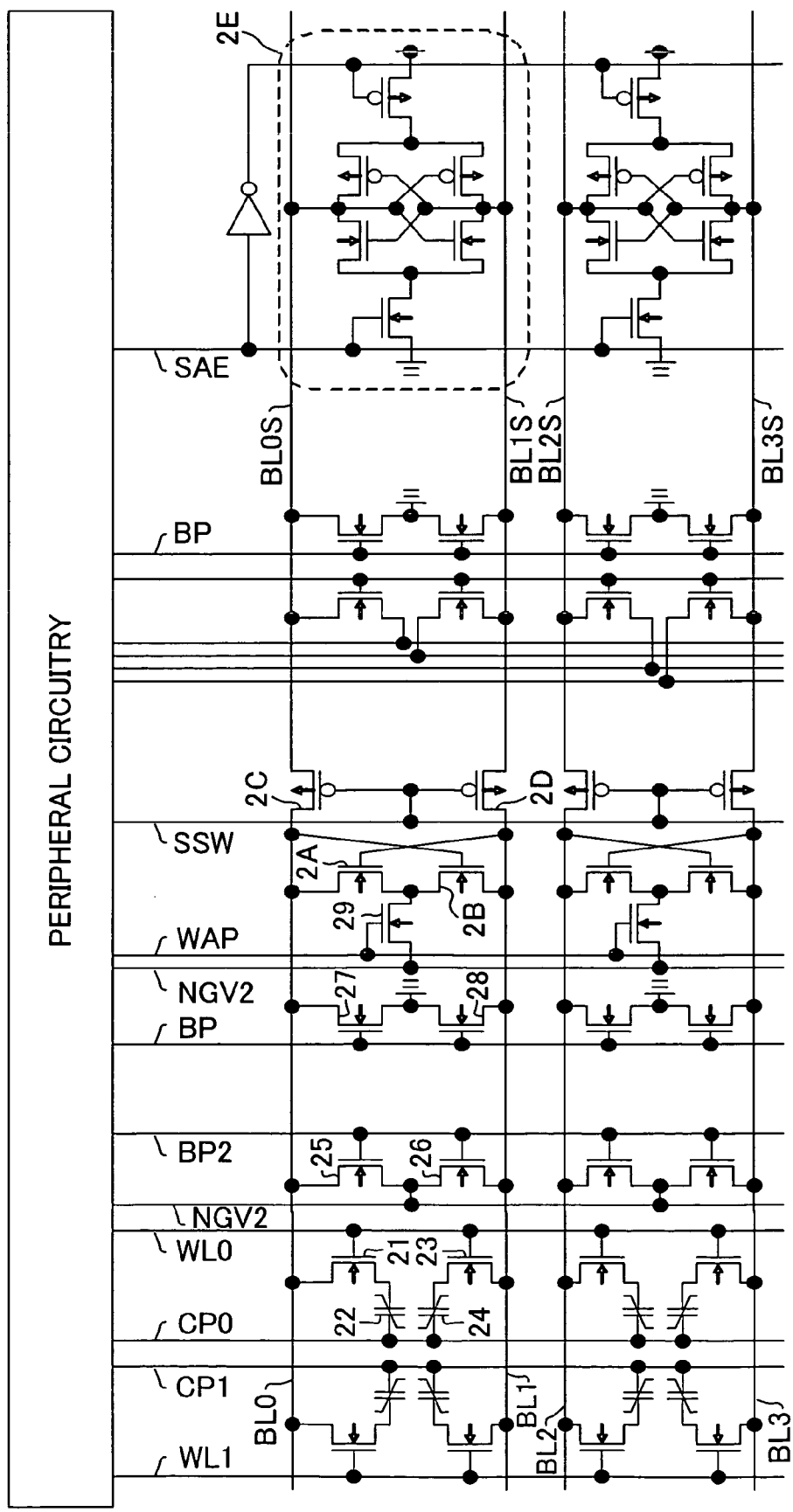
FIG. 6 is a structure diagram of the second embodiment of the present invention.

FIG. 6 illustrates a portion of a 2T2C memory cell array of the ferroelectric memory of the second embodiment of the present invention, and peripheral circuitry thereof. In this embodiment, the second bit line precharge signal BP2 is connected to gates of the third and fourth transistors 25 and 26, the second negative potential NGV2 is connected to sources of the third and fourth transistors 25 and 26, the first bit line BL0 is connected to a drain of the third transistor 25, and the second bit line BL1 is connected to a drain of the fourth transistor 26. The other points are similar to those of FIG. 4. WL0 and WL1, CP0 and CP1, BP2, BP, NGV2, WAP, SSW, and SAE are connected to the peripheral circuitry, and CP0 and CP1 are connected to a ground potential in the peripheral circuitry.

Next, a read operation and a rewrite operation when the "H" data is held in the first ferroelectric capacitor 22 and the "L" data is held in the second ferroelectric capacitor 24 in FIG. 6, will be described. Initially, it is assumed that, at time t01 of FIG. 5, BP and SSW have the logic voltage "H", BP2, SAE, and WAP have the logic voltage "L", and WL0 has NGV1. In this case, the first and second bit lines BL0 and BL1 go to the logic voltage "L" since the fifth and sixth transistors 27 and 28 are ON. Next, at t02, when BP and SSW are caused to go to the logic voltage "L", the first and second bit lines BL0 and BL1 and the first and second sense amplifier portion bit lines BL0S to BL1S go to a floating state. At time t03, when BP2 is caused to go to the logic voltage "H", the third and fourth transistors 25 and 26 are turned ON, so that the first and second bit lines BL0 and BL1 are precharged to the second negative potential NGV2. When BP2 is caused to go to the logic voltage "L" so that the third and fourth transistors 25 and 26 are turned OFF at time t04, and thereafter, the first word line WL0 is caused to go to a boosted potential VPP at time t05, the "H" data is read from the first ferroelectric capacitor 22, which holds the "H" data, and a potential corresponding to the "H" data appears on the first bit line BL0, and the "L" data is read from the second ferroelectric capacitor 24, which holds the "L" data, and a potential corresponding to the "L" data appears on the second bit line BL1. In this situation, at time t06, when SAE is caused to go to the logic voltage "H" to start up the sense amplifier 2E, BL0 is amplified to the logic voltage "H" and BL1 is amplified to the logic voltage "L" (ground potential). At time t09, when WAP is caused to go to the logic voltage "H", BL1 is amplified to the second negative potential NGV2. For time t09 to time t12, when the cell plate lines CP0 and CP1 have the ground potential, the logic voltage "H" is applied to the first bit line BL0, so that a potential of +VDD is applied to the first ferroelectric capacitor 22, thereby the "H" data is rewritten into the first ferroelectric capacitor 22, and the second negative voltage NGV2 is applied to the second bit line BL1, so that a potential of −NGV2 is applied to the second ferroelectric capacitor 24, thereby "L" data is rewritten into the second ferroelectric capacitor 24. Next, at time t12, when BP and SSW are caused to go to the logic voltage "H" and SAE and WAP are caused to go to the logic voltage "L", the first and second bit lines BL0 and BL1 go to the logic voltage "L". Finally, at time t13, the read and rewrite operations are ended, where the first word line WL0 has the logic voltage "L".

As described above, in the ferroelectric memory of the second embodiment of the present invention, the bit lines BL0 and BL1 are precharged to the negative potential NGV2, thereby making it possible to precharge with high speed and low power consumption, and in addition, the cell plate lines CP0 and CP1 are fixed to a potential substantially equal to the ground potential, and the "H" data and the "L" data are simultaneously written, whereby a high speed operation can be achieved without an increase in chip size.

Note that, in the first and second embodiments, the potential difference NGV2 between the cell plate lines CP0 and CP1 having a potential substantially equal to the ground potential and the bit line having a negative potential, may be smaller than or equal to a built-in voltage of the transistors. Thereby, a current does not flow from the bit line to the substrate having a potential substantially equal to the ground potential, whereby the substrate structure can be a twin well and the process cost can be reduced.

In the first and second embodiments, the absolute value of a potential difference between the cell plate lines CP0 and CP1 whose potential is substantially equal to the ground potential and one bit line which is amplified to a positive potential substantially equal to VDD, may be different from the absolute value of a potential difference between the cell plate lines CP0 and CP1 whose potential is substantially equal to the ground potential and the other bit line which is amplified to the negative potential NGV2. Since the potential difference differs between when the "H" data is written and when the "L" data is written, for example, a potential when the "L" data is rewritten as the "H" data is smaller than a potential when the "H" data is the same as the "L" data. In this case, imprint is unlikely to occur, so that imprint characteristics can be improved.

Figure 7:
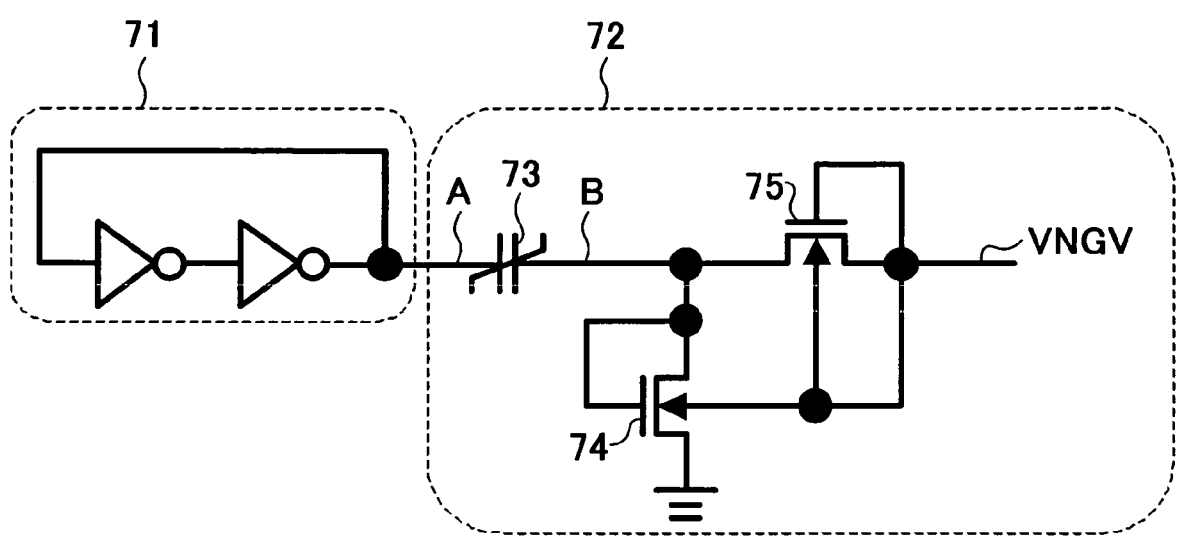
FIG. 7 is a structure diagram of a negative potential generating circuit of the present invention.

Next, a negative potential generating circuit which is preferably used in the ferroelectric memory of the first and second embodiments, will be described. FIG. 7 is a structure diagram of the negative potential generating circuit, and FIG. 8 is an operation timing chart of the negative potential generating circuit.

In FIG. 7, 71 indicates a ring oscillator, 72 indicates a charge pump circuit, 73 indicates a ferroelectric capacitor, 74 indicates a first transistor, 75 indicates a second transistor, and VNGV indicates a negative potential. A node A indicates an output of the ring oscillator 71, and is connected to a first electrode of the ferroelectric capacitor 73, and a node B is a second electrode of the ferroelectric capacitor 73.

Figure 8:
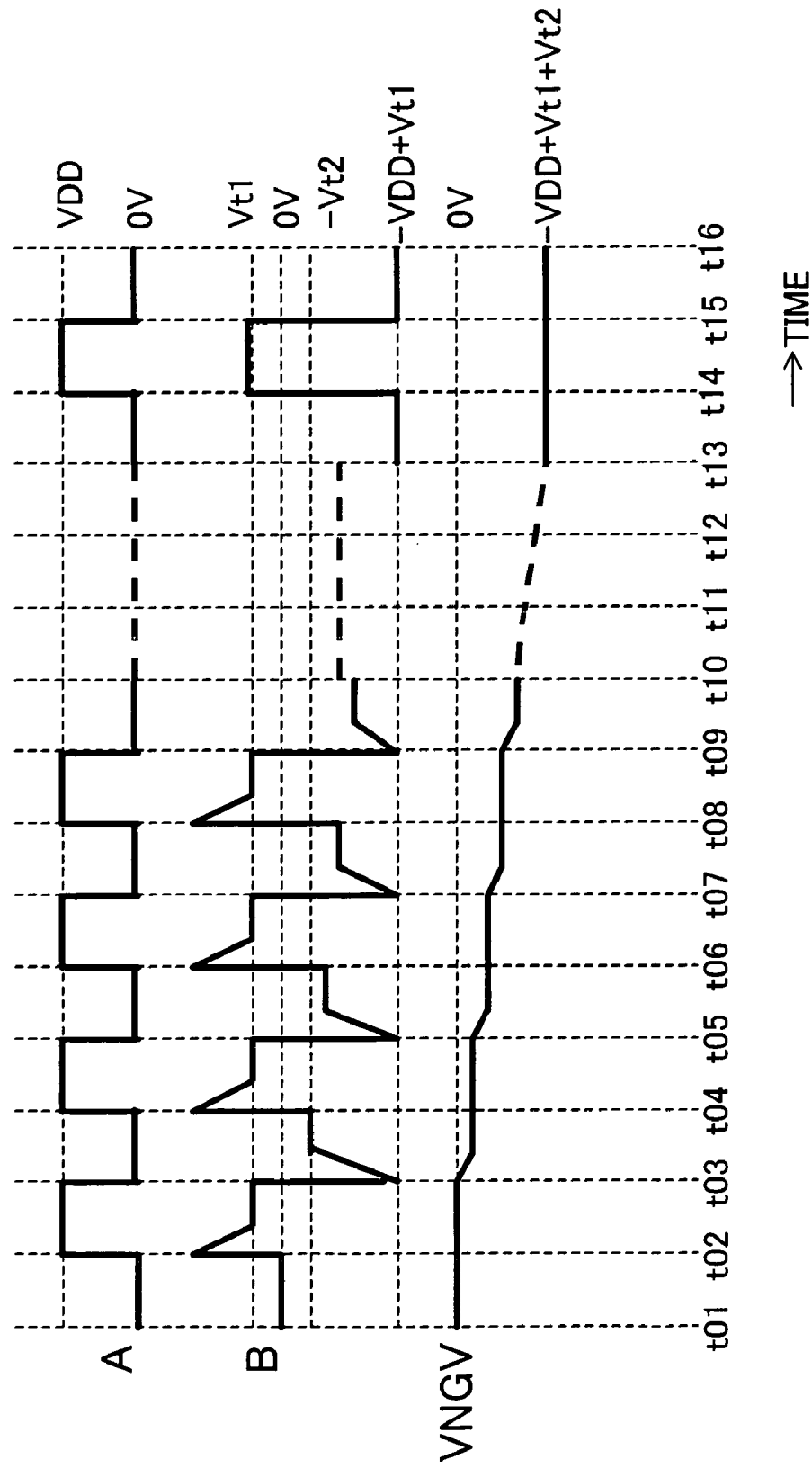
FIG. 8 is an operation timing chart of the negative potential generating circuit of the present invention.

Initially, in FIG. 8, at time t01, when the node A is assumed to have 0 V, the node B and VNGV have 0 V. Next, at time t02, when the node A is caused to go to VDD, VDD occurs at the node B for a moment. However, since the first transistor 74 is turned ON, the first transistor 74 is discharged to a threshold Vt1 with a predetermined time constant before the first transistor 74 is turned OFF. In this case, a gate and a source of the second transistor 75 are connected together and have an equal potential, so that the second transistor 75 is OFF. Next, at time t03, when the voltage of the node A is lowered from VDD to 0 V, the voltage of the node B decreases to −VDD+Vt1 for a moment, so that the first transistor 74 is turned OFF and the second transistor 75 is turned ON, and therefore, the node B is charged to −Vt2. Thereby, electric charge is injected into VNGV in an amount equal to this accumulated electric charge, so that VNGV has a slightly negative potential. When VNGV reaches −VDD+Vt1+Vt2 by repeatedly performing such an operation, supply of electrons into VNGV stops. The ferroelectric capacitor 73 has a smaller area and a higher capacitance value than those of paraelectric capacitors, resulting in a small chip.

Although 2T2C ferroelectric memories are described as examples in the foregoing description, the present invention can be applied to a one-transistor, one-capacitor (1T1C) ferroelectric memory. The method of fixing a cell plate line to a potential substantially equal to a ground potential, and driving a bit line to positive and negative voltages, can also be applied to, in addition to ferroelectric memories, a semiconductor memory device which has a memory cell composed of a field effect transistor and a capacitor, and in which a word line is connected to a gate of the transistor, a bit line is connected to a drain of the transistor, a first electrode of the capacitor is connected to a source of the transistor, a cell plate line is connected to a second electrode of the capacitor, and the memory cell is placed at an intersection between the word line and the bit line.

Figure 9:
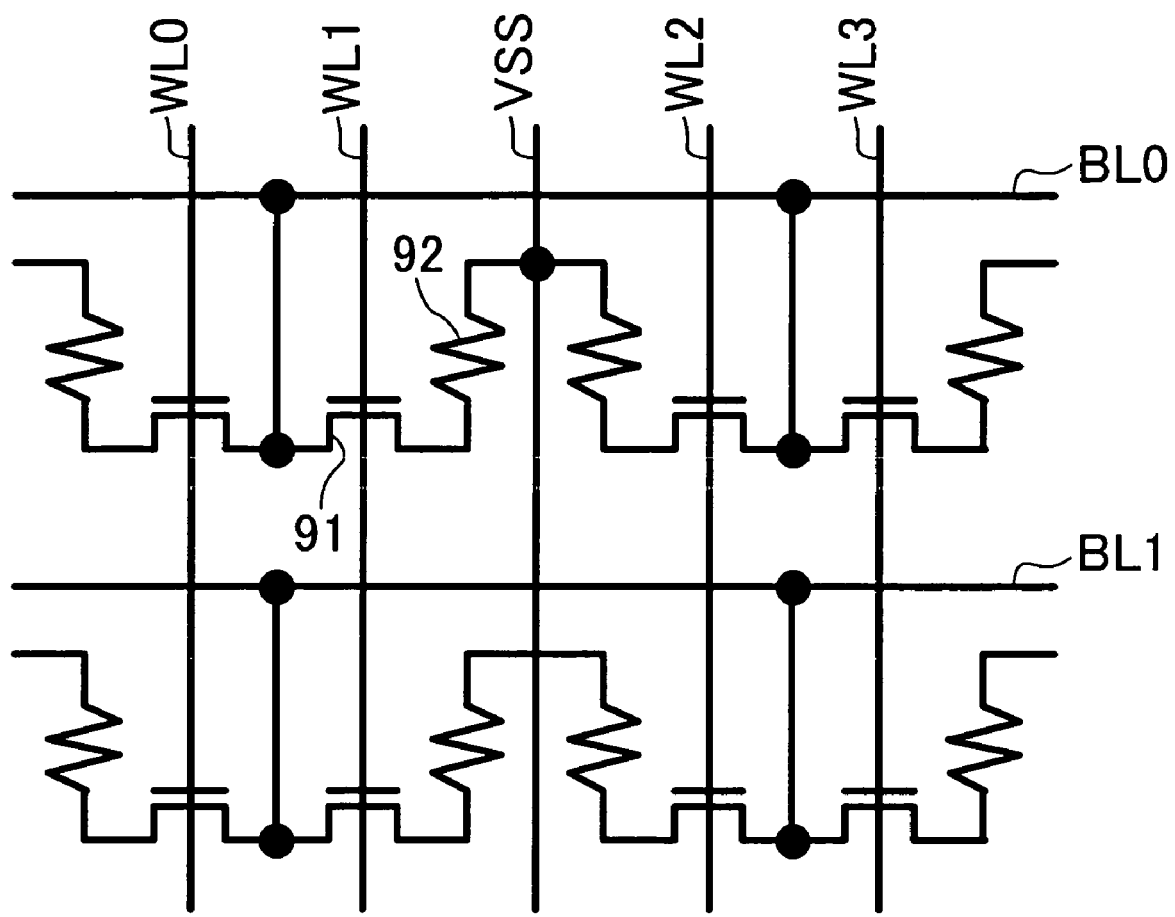
FIG. 9 is a memory cell structure diagram of a third embodiment of the present invention.

Finally, a ferroelectric memory according to a third embodiment of the present invention will be described with reference to the drawings. FIG. 9 is a structure diagram of memory cells in the third embodiment of the present invention.

In FIG. 9, WL0 to WL3 indicate first to fourth word lines, BL0 and BL1 indicate first and second bit lines, 91 indicates a transistor, and 92 indicates a resistor. The second word line WL1 is connected to a gate of the transistor 91, the first bit line BL0 is connected to a drain of the transistor 91, a first node of the resistor 92 is connected to a source (storage node) of the transistor 91, and a ground potential VSS (0 V) is connected to a second node of the resistor 92. The first and second bit lines BL0 and BL1 are driven with positive and negative voltages.

As described above, in the semiconductor memory device which has the resistor 92 in a memory cell, one node is fixed to a ground potential and the resistor 92 is used as a memory device instead of a ferroelectric capacitor, thereby making it possible to achieve high-speed and highly-reliable operation.

What is claimed is:

1. A semiconductor memory device comprising a memory cell composed of a transistor and a capacitor, and in which a word line is connected to a gate of the transistor, a bit line is connected to a drain of the transistor, a first electrode of the capacitor is connected to a source of the transistor, a cell plate line is connected to a second electrode of the capacitor, and the memory cell is placed at an intersection between the word line and the bit line, wherein the cell plate line is fixed to a potential substantially equal to a ground potential and the bit line is amplified to a positive voltage and a negative voltage to read a potential difference between the positive voltage and the cell plate line or a potential difference between the negative voltage and the cell plate line.

2. The semiconductor memory device of claim 1, wherein the capacitor is composed of a ferroelectric capacitor.

3. The semiconductor memory device of claim 2, wherein an absolute value of a difference between a lowest potential of a bit line amplitude and a potential of the cell plate line is larger than or equal to a coercive voltage of the ferroelectric capacitor.

4. The semiconductor memory device of claim 1, wherein a lowest potential of a word line control signal is substantially equal to a lowest potential of a bit line amplitude.

5. The semiconductor memory device of claim 1, wherein the transistor in the memory cell is an N-channel MOS transistor, a lowest potential of a word line control signal amplitude is larger than a lowest potential of a bit line amplitude, and an absolute value of a difference between the lowest potential of the word line control signal amplitude and the lowest potential of the bit line amplitude is smaller than a threshold voltage of the transistor in the memory cell.

6. The semiconductor memory device of claim 1, wherein the transistor in the memory cell is an N-channel MOS transistor, and a lowest potential of a word line control signal amplitude is smaller than a lowest potential of a bit line amplitude.

7. The semiconductor memory device of claim 1, wherein a sense bit line to which a sense amplifier is connected is separated from the bit line to which the memory cell is connected, via a field effect transistor.

8. The semiconductor memory device of claim 7, wherein the field effect transistor is composed of a P-channel MOS transistor.

9. The semiconductor memory device of claim 1, wherein a lowest potential of an amplitude of a sense bit line to which a sense amplifier is connected is different from a lowest potential of an amplitude of the bit line to which the memory cell is connected.

10. The semiconductor memory device of claim 1, wherein the bit line is precharged to the positive voltage.

11. The semiconductor memory device of claim 10, wherein only a selected bit line is driven.

12. The semiconductor memory device of claim 11, wherein the selected bit line is driven with a first amplitude, and thereafter, is driven with a second amplitude which is different from the first amplitude.

13. The semiconductor memory device of claim 12, wherein the first drive amplitude for the selected bit line is larger than the second drive amplitude for the selected bit line.

14. The semiconductor memory device of claim 1, wherein the bit line is precharged to the negative voltage.

15. The semiconductor memory device of claim 14, wherein only a selected bit line is driven.

16. The semiconductor memory device of claim 15, wherein the selected bit line is driven with a first amplitude, and thereafter, is driven with a second amplitude which is different from the first amplitude.

17. The semiconductor memory device of claim 16, wherein the first drive amplitude for the selected bit line is larger than the second drive amplitude for the selected bit line.

18. The semiconductor memory device of claim 1, wherein the negative voltage of the bit line is set using a negative power source.

19. The semiconductor memory device of claim 1, wherein the negative voltage of the bit line is set by capacitor coupling.

20. The semiconductor memory device of claim 19, wherein a capacitor for the capacitor coupling is composed of a ferroelectric capacitor.

21. The semiconductor memory device of claim 1, wherein a difference between a lowest potential of a bit line amplitude and a potential of the cell plate line is smaller than a threshold voltage of the transistor.

22. The semiconductor memory device of claim 1, wherein a difference between a potential of the cell plate line and a "H" data write voltage, is different from a difference between the potential of the cell plate line and a "L" data write voltage.

* * * * *